United States Patent [19]

Needham

[11] Patent Number: 4,525,246

[45] Date of Patent: Jun. 25, 1985

[54] MAKING SOLDERABLE PRINTED CIRCUIT BOARDS

[75] Inventor: Maurice E. Needham, Andover, Mass.

[73] Assignee: Hadco Corporation, Salem, N.H.

[21] Appl. No.: 391,969

[22] Filed: Jun. 24, 1982

[51] Int. Cl.³ .................... C25D 5/02; H01K 3/42
[52] U.S. Cl. ................................. 204/15; 29/852; 174/68.5
[58] Field of Search ................ 204/15; 174/68.5; 29/852, 853; 427/97; 430/312, 313, 314, 316, 318; 156/629-634, 656, 901, 902, 150

[56] References Cited

U.S. PATENT DOCUMENTS

| | | | |
|---|---|---|---|
| 2,872,391 | 2/1959 | Hauser et al. | 204/15 |
| 3,483,615 | 12/1969 | Gottfried | 29/625 |
| 3,673,680 | 7/1972 | Tanaka et al. | 204/15 |
| 3,742,597 | 7/1973 | Davis | 29/625 |
| 4,104,111 | 8/1978 | Mack | 174/68.5 X |
| 4,304,640 | 12/1981 | Walker | 204/15 |

Primary Examiner—Thomas Tufariello
Attorney, Agent, or Firm—Andrew F. Kehoe

[57] ABSTRACT

An improved process for making a printed circuit board of the type comprising solder-rooted pads and a solder-coated internal wall of each hole in the circuit board. The new process comprises the step of masking over a dry film, e.g. an alkaline ink film, after copper plating and before solder plating. In one embodiment of the invention, a selectively-plated thin layer of solder to act as a resist except on the areas defined by hole pads and barrels but is wholly free of solder which can melt and cause solder-migration problems under the surface of the printed circuit board.

4 Claims, 6 Drawing Figures

MAKING SOLDERABLE PRINTED CIRCUIT BOARDS

BACKGROUND OF THE INVENTION

This invention relates to the manufacture of printed circuit boards (PCBs) and especially to an improved process for making circuit boards of the solder-compatible type.

A circuit board of the general type to which the subject application relates is shown in U.S. Pat. No. 3,742,597. The PCB described therein is highly satisfactory but serious problems are encountered in the manufacturing process disclosed therein that tend to increase its cost and to reduce drastically the product yield. For example, the tolerances in matching electroconductive islands with preformed conductive terminal pads, without leaving gaps, proved to require excessive care. Moreover, the total number of processing steps assures that the resulting PCB must be undesirably expensive.

The general problem of manufacturing solder-compatible PCBs was then addressed by other inventors including Mack who describes a relatively complex method to overcome some of the problems inherent in the process disclosed in U.S. Pat. No. 4,104,111. Mack relied upon an extra tin/nickel coating to help assure dependable production of a suitable solder-bearing PCB. Further reference can be made to U.S. Pat. No. 4,104,111 for a good description of prior art relating to PCB manufacture.

Despite this earlier work, it has remained a problem to provide a solder-bearing PCB with a process which is, at once, both economic and dependable in that very close conductor lines may be formed and subjected to wave-soldering procedures to provide high-density, solder-compatible PCBs wherein a thin electroplated solder is used as a chemical resist during manufacture.

SUMMARY OF THE INVENTION

It is an object of the present invention to provide an improved process for making an improved resin-coated printed circuit board (PCB) whereby conductor lines may be very close to each other and yet the PCB may be wave-soldered without damage to adhesion of a resin overcoat to the board.

Another object of the invention is to provide a relatively inexpensive process for making a highly dependable PCB of the solder-compatible type.

A further object of the invention is to utilize a metallic resist material that simplifies manufacture and subsequent processing, and, in a proper case, provides a chemically protective material over copper conductors.

Other objects will be obvious to those skilled in the art on their reading of this disclosure.

The above objects have been achieved by providing a process whereby all copper-circuit portions of the PCB may be plated onto the board at once and before any solder plating is done and wherein all solder is deposited directly on the copper without intermediate metallic coatings.

Thus in the process of the invention a thin electroplated solder coating which serves as a chemically-protective material is placed directly over the copper which is to serve as the conductor. In some cases the "thin solder coating" described herein is too thin to function as a solderable metal. It serves as a chemical resist. This "thin-solder" resist may be etched from the board before finishing of the PCB. However, light solder coatings of 0.0002 inch thick or even 0.00001 inch thick, or lower are suitable for use in this application.

Preferred solders are the lead/tin solders known to the art. However other solder-compatible resist metals which are not higher melting than lead/tin solders may also be used in some circumstances.

Also the term "solder-functional" is used to define solder layers which, even if initially of poor soldering quality, are of suitable thickness to be converted to a solder-functional layer with the heat-treatment sometimes called "reflow" in the PCB art.

ILLUSTRATIVE EXAMPLE OF THE INVENTION

In the application and accompanying drawings there is shown and described a preferred embodiment of the invention and suggested various alternatives and modifications thereof, but it is to be understood that these are not intended to be exhaustive and that other changes and modifications can be made within the scope of the invention. These suggestions herein are selected and included for purposes of illustration in order that others skilled in the art will more fully understand the invention and the principles thereof and will be able to modify it and embody it in a variety of forms, each as may be best suited in the condition of a particular case.

FIG. 1 shows a copper-covered circuit board blank.

FIG. 2 shows the board of FIG. 1 after processing to place masking material 14 over the non-circuit area thereof.

FIG. 3 shows the board of FIG. 2 further processed to add more copper over the circuit areas thereof.

FIG. 4 shows the board of FIG. 3 with a further masking material added over the masking material of FIG. 2 and the circuit paths but not those portions of the circuits forming hole pads and hole surfaces (barrels).

FIG. 5 shows the board of FIG. 4 with a thin solder coating selectively plated over the hole pads and barrels.

FIG. 6 shows the board of FIG. 5 with making materials and a copper base layer removed.

EXAMPLE 1

Figure 1:
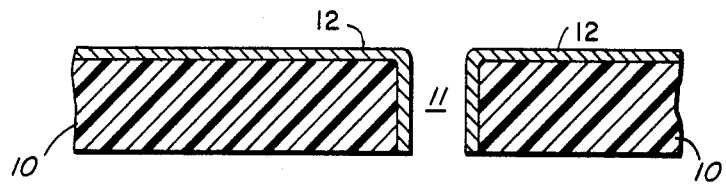
FIGS. 1 through 6 show a sequence of various stages in the manufacture of a circuit board according to the invention.

As illustrated in FIG. 1, a circuit board substrate blank 10 is drilled to form holes like hole 11 and, after appropriate cleaning, the top surface and the walls of holes 11 are coated with a very thin layer 12 of copper, all as well known in the art of making PCBs.

After the circuit board is so prepared, a coating of a photopolymerizable plating resist of the aqueous type is placed on the surface of the plate. Such plating resist are well-known in the art. Thereupon, a light screen, i.e., an ultraviolet mask is placed over the surface of board. The screen protects the masking material from ultraviolet light. The resist-coated structure is exposed to ultraviolet light. Where the mask has been so protected from light, the nonpolymerized portion of the mask can be readily removed by use of well-known developer chemicals. After the removable mask material has been washed off with a developer chemical, there remains a coating of photopolymerized masking material 14 over portions of the thin copper coating. In other areas, i.e., those defining the circuit paths, pads and the surfaces, sometimes called barrels, of the holes, 11 the thin copper 12 remains on the surface. (See FIG. 2).

Figure 2:
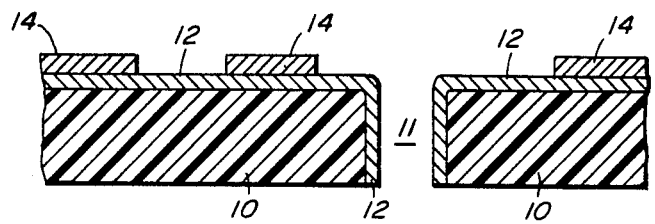

Thereupon, the board of FIG. 2 is copper plated over the area from which the mask material has been removed, i.e., over the pads, other conductive paths, and hole surfaces. A copper coating 16 of about 0.0005 inches to 0.005 inches of copper is used. (See FIG. 3). A copper coating of 0.0015 inches is suitable for most applications.

Figure 3:
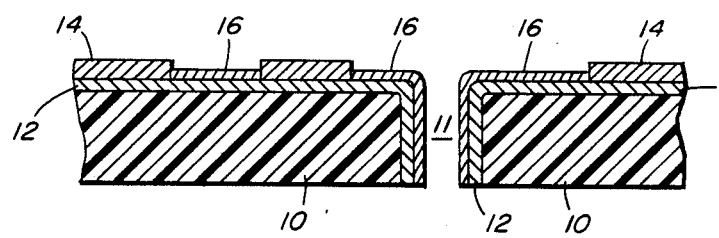

At this point, a further masking material, preferably a protective ink of the alkaline-strippable type, plating resist 18, is selectively coated over the structure of FIG. 3 (See FIG. 4) to cover original mask material 14. The circuit paths 16a are also covered but pads and interior surfaces (i.e., barrels) of the holes exposed.

Next, a thin coating 20 of about 0.00001 to 0.0003 inches of solder (say, tin/lead solder) is electroplated over the exposed pads and hole surfaces: (See FIG. 5). This coating, particularly when in the range of 0.00001 to 0.0002 inches thick acts as a chemical resist during subsequent processing and will serve as a protective layer for underlying copper during storage.

Figure 6:
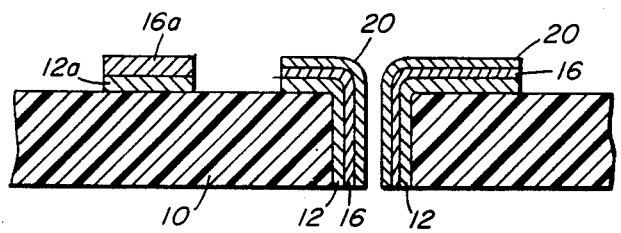

At this point all the necessary copper and solder are on the PCB. It is then necessary to remove the remaining masking materials, 14 and 18. This can be done, in the illustrative case, by using a caustic stripping agent of the type well known in the art. The next step is to remove the thin copper coating from those areas of the board not meant to conduct electrical current. This is accomplished by a flash etch which removes that portion of thin copper layer 12 which had heretofore been protected by mask material 14. FIG. 6 illustrates the PCB after the masking material 14 and 18 and that portion of copper layer 12, once protected by the mask, have been removed.

The PCB, as seen in FIG. 6 is, typically, finished (by the initial manufacturer or his customer) by placing a final, permanent, non-conductive masking material over circuit board conductor lines defined by 16a portions of the circuit boards to which subsequent soldered connections need not be made.

Also, after the masking, the electroplated solder is heated, as is known in the art, to the extent necessary to place it in a lower-melting, solder-like form than is the case with the electroplated solder layer. This is typically accomplished by a brief heating within the range of 390° to 425° F. When solder coatings of less than about 0.0003 inches are used, the material will not be solder-functional. Nevertheless the heat treatment helps to improve adhesion and the continuity of the copper coating.

The resulting circuit board will be of excellent quality, as measured by its ability to withstand and facilitate solder-wave-type addition of connections, a process wherein the PCB may experience temperatures as high as 475°–500° F. This is true even when the conductor pattern is such that the conductor lines are but a few thousandths of one inch apart from one another and the conductor lines are very thin.

EXAMPLE 2

Figure 4:
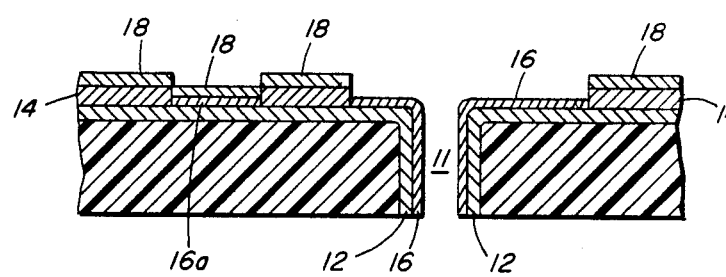
Figure 5:
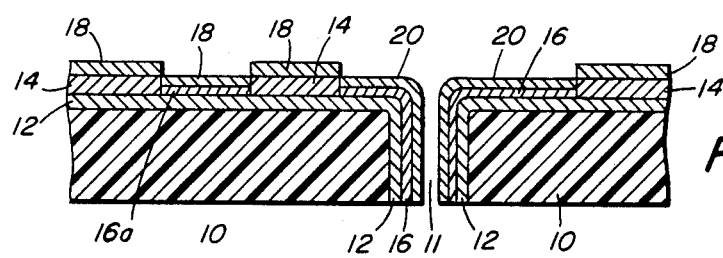

The procedure of Example 1 is followed except that
(A) A very light solder plating is electroplated over the copper plate 16 as is shown in FIG. 3 before masking (18) step shown in FIG. 4. The light-solder coating serves as a resist and is conveniently from about 0.00001 to 0.0003 inches thick and covers not only pads and hole barrels, but also covers the conductor lines or circuit paths as indicated at 16a.
(B) A heavier solder coating, up to 0.004 inches, but more usually about 0.002 inches of solder is electroplated on in place of solder plate 20 as shown in FIG. 5. The electroplated coating, on subsequent heat-treatment will be converted to a eutectic solder composition.
(C) The foregoing changes, A and B, from the procedure of Example 1 allow a less critical etching step when one is removing the original copper coating 12.

In the procedure described above, the solder coating from step A remains on the copper conductor areas. It is not limited to the pads, i.e. areas around the holes, and the holes barrels, i.e. surfaces within the holes.

However, it should be noted that one function of the light solder resist has been to provide a chemical protection during processing, e.g. during etching. Therefore, in some situations, it may be desirable to remove the thin solder from the circuit paths by a further etch before further processing.

EXAMPLE 3

The procedure of Example 2 is followed with the following changes.
(A) The second masking step 18 is omitted and, instead of adding mask 18, one proceeds directly to the stripping of mask 14.
(B) There is no additional soldering after the light-soldering step.

The light solder of FIG. 2 from the circuit pattern usually remains on the product to serve as a protective layer. It can be removed before finish processing if the customer so desires.

As used in the following claims, the term solder is used to describe a low-melting metallic material such as tin-lead. However, it is not meant to indicate that the material is always thick enough to function as a solder. For example, a 0.0001 inch-thick electroplated coating functions well as a protective layer but not as solder-facilitating means.

It is noted, however, that even when an immobile, thin, metallic coating is used, the coating is subjected to the same heating step. The primary function of such a coating in this arrangement is to increase the adhesion of solder to copper and, to a certain extent to heal defects in the coating. However, the term "reflow" usually used to describe thermal post-treatment of solder is a misnomer when applied to the coatings such as the 0.0002-inch protective coatings which are used in the processes of the invention.

It is also to be understood that the following claims are intended to cover all of the generic and specific features of the invention herein described and all statements of the scope of the invention which might be said to fall therebetween.

What is claimed is:

1. In a process for making a copper-circuit-bearing printed circuit board of the solder-compatible type wherein circuit board hole barrels and pads around said holes are coated with a quantity of solder sufficient to facilitate making soldered connections to said printed-circuit board, the improvement wherein
   a first, thin non-solderable solder layer is electroplated directly over said copper circuit, said first solder layer is covered with a protective mask except in the areas defined by hole pads and hole barrels, and said hole pads and hole barrels are then given a heavier, solder-functional coating of solder before said protective mask is removed from said first solder layer.

2. A process as defined in claim 1 wherein said first solder layer stripped of said mask is thereafter removed from said printed circuit board.

3. A process as defined in claim 1 or 2 wherein said first solder layer is less than 0.0003 inches thick.

4. A process as defined in claim 1 wherein said first solder layer forms a chemically-protective layer and is not readily solderable.

* * * * *